United States Patent
Liu et al.

(10) Patent No.: US 7,569,480 B2
(45) Date of Patent: Aug. 4, 2009

(54) SEMICONDUCTOR DEVICES AND METHODS OF FABRICATING THE SAME

(75) Inventors: Jin Hua Liu, Yongin-si (KR); Jong-Hyon Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 8 days.

(21) Appl. No.: 11/878,351

(22) Filed: Jul. 24, 2007

(65) Prior Publication Data
US 2008/0026519 A1 Jan. 31, 2008

(30) Foreign Application Priority Data
Jul. 25, 2006 (KR) .................... 10-2006-0069883

(51) Int. Cl.
*H01L 21/4763* (2006.01)
(52) U.S. Cl. .................... 438/638; 438/585; 438/589
(58) Field of Classification Search ............... 438/585, 438/589, 638
See application file for complete search history.

(56) References Cited

U.S. PATENT DOCUMENTS

| 6,531,410 | B2 | 3/2003 | Bertin et al. |
| 2001/0033000 | A1* | 10/2001 | Mistry .................... 257/339 |
| 2001/0044191 | A1* | 11/2001 | Huang-Lu et al. ............ 438/305 |
| 2002/0048970 | A1 | 4/2002 | Feudel et al. |
| 2004/0058498 | A1* | 3/2004 | Huang et al. ................ 438/287 |
| 2005/0140012 | A1* | 6/2005 | Jung .......................... 257/762 |

FOREIGN PATENT DOCUMENTS

| KR | 1019940010567 B1 | 10/1994 |
| KR | 1999-0042916 | 6/1999 |
| KR | 1999-0072327 | 9/1999 |
| KR | 10-2001-0083626 | 9/2001 |
| KR | 10-2004-0000264 | 1/2004 |
| KR | 10-2005-0009485 | 1/2005 |

* cited by examiner

*Primary Examiner*—Ha Tran T Nguyen
*Assistant Examiner*—Karen M Kusumakar
(74) *Attorney, Agent, or Firm*—Harness, Dickey & Pierce, P.L.C.

(57) ABSTRACT

In a method of fabricating a semiconductor device, a first mask pattern is formed on a substrate. The first mask pattern has a first opening formed to expose the substrate. An oxidation barrier region is formed in the substrate exposed by the first opening, and the first mask pattern is patterned to form a second mask pattern having a second opening. A gate insulation layer is formed on the substrate exposed by the second opening. The gate insulation layer has a variable thickness.

22 Claims, 8 Drawing Sheets

US 7,569,480 B2

SEMICONDUCTOR DEVICES AND METHODS OF FABRICATING THE SAME

PRIORITY STATEMENT

This U.S. non-provisional patent application claims priority under 35 U.S.C. § 119 to Korean Patent Application No. 10-2006-0069883, filed on Jul. 25, 2006, the entire contents of which is incorporated herein by reference.

BACKGROUND

As integration density of conventional semiconductor devices increases, a thinner gate insulation layer may be used to suppress short channel effects and regulate a threshold voltage $V_{th}$. However, as gate insulation layer thickness decreases, a leakage current of a transistor resulting from tunneling to a gate electrode may increase and/or a breakdown phenomenon of the gate insulation layer may occur.

Conventionally, a gate insulation layer may be comprised of a high-k dielectric. The high-k dielectric may enable the gate insulation layer to remain more stable against the leakage current and/or the breakdown phenomenon. Moreover, the short channel effect of the transistor may be suppressed and/or the threshold voltage may be more easily regulated to cope with size reduction, increased integration and/or higher operating speeds of semiconductor devices.

Although conventional gate insulation layers may be comprised of the high-k dielectric, the leakage current may still exist because of gate induced drain leakage (GIDL) caused by concentration of an electric field established at the overlap area of a drain and the gate electrode. When the transistor is OFF or a negative bias applied a negative voltage, a relatively thin depletion layer may be formed at a drain region due to a gate bias applied to the gate electrode to concentrate the electric field at the edge of the drain adjacent to the gate electrode. The concentration of the electric field may result in the GIDL, which may increase in geometric progression with an increasing electric field.

To suppress the GIDL, conventionally, the gate insulation layer thickness may be reduced, doping concentration of lightly doped drain (LDD) may be reduced, concentration of a well formed at the semiconductor substrate may be reduced, an overlap area of the gate electrode and source/drain may be reduced and/or a tunneling volume (e.g., by heavily doping a drain to reduce the width of a depletion area) may be reduced. These conventional methods may increase the resistance of the LDD, which may degrade functionality of a semiconductor device (e.g., on-current of the transistor may decrease).

SUMMARY

Example embodiments provide semiconductor devices and methods of fabricating semiconductor devices.

According to at least one example embodiment, a first mask pattern may be formed on a semiconductor substrate. The first mask pattern may have a T-shaped opening exposing the semiconductor substrate. An oxidation barrier region may be formed in the exposed portion of the semiconductor substrate. The first mask pattern may be patterned to form a second mask pattern having an I-shaped opening exposing another portion of the semiconductor substrate. A gate insulation layer may be formed on the exposed portion of the semiconductor substrate. The gate insulation layer may have a larger thickness at or near its edge than at the oxidation barrier region.

In at least one other example embodiment, a mask pattern may be formed on a semiconductor substrate. The mask pattern may have a first opening formed to expose the semiconductor substrate. An oxidation barrier region may be formed in the semiconductor substrate exposed by the first opening. A sidewall of the mask pattern may be etched to form a second opening extended to have a larger size than the oxidation barrier region. A sacrificial spacer may be formed on an inner sidewall of the second opening of the mask pattern, and a gate insulation layer may be formed on the semiconductor substrate exposed by the second opening. The gate insulation layer may have a larger thickness at or near its edge than at the oxidation barrier region.

At least one example embodiment provides a method of fabricating a semiconductor device. According to at least this example embodiment, a first mask pattern may be formed on a substrate. The first mask pattern may have a first opening exposing a first portion of the substrate. An oxidation barrier region may be formed in the exposed first portion of the substrate. The first mask pattern may be patterned to form a second mask pattern having a second opening. The second opening may expose a second portion of the substrate, and may be shaped differently than the first opening. A gate insulation layer may be formed on the exposed second portion of the substrate and may have a variable thickness.

According to at least some example embodiments, the first opening may be T-shaped and the second opening may be I-shaped. The exposed second portion of the substrate may be larger than the exposed first portion of the substrate.

The gate insulation layer may have a larger thickness at an edge portion than at the oxidation barrier region.

According to at least some example embodiments, a lower mask layer may be formed on the substrate, and an upper mask layer may be formed on the lower mask layer. The upper mask layer and the lower mask layer may be etched to form an upper mask layer pattern and a lower mask layer pattern. The upper mask layer pattern and the lower mask layer pattern may expose the first portion of the substrate. The upper mask layer pattern may be partially etched to expose a portion of the lower mask layer pattern. The upper mask layer may have a higher etch selectivity than the lower mask layer and may include silicon nitride. The lower mask layer may include silicon oxide. The oxidation barrier region may be formed using a nitrogen ion implanting process.

According to at least some example embodiments, the exposed portion of the lower mask layer pattern may be removed, and a spacer may be formed on an inner sidewall of the second opening. The spacer may include silicon nitride.

The gate insulation layer may be formed using a thermal oxidation process.

According to at least some example embodiments, a gate conductive layer may be formed to fill the second opening, and the gate conductive layer may be planarized to form a gate electrode. The second mask pattern and the spacer may be removed. The gate conductive layer may be planarized using a polishing process using the second mask pattern as a polish-stop layer. The polishing process may include a chemical mechanical polishing process. The gate conductive layer may include polysilicon.

According to at least some example embodiments, an offset spacer may be formed on opposite sidewalls of the gate insulation layer and the gate electrode, and an extension region may be formed adjacent to the offset spacer in the semiconductor substrate. An insulating spacer may be formed on a sidewall of the offset spacer, and a source/drain region may be formed adjacent to the insulating spacer in the substrate. The source/drain region may at least partially overlap the extension region. The offset spacer may include at least one of a thermal oxide and a low temperature oxide. The offset spacer may be arranged in a stack structure including the thermal oxide and the low temperature oxide which are stacked in the order name.

According to at least some example embodiments, a sidewall of the first mask pattern may be etched to form the second opening. The second opening may be larger than the oxidation barrier region. A spacer may be formed on an inner sidewall of the second opening.

BRIEF DESCRIPTION OF THE DRAWINGS

Example embodiments will be described with respect to the drawings in which.

DETAILED DESCRIPTION OF EXAMPLE EMBODIMENTS

Figure 1:
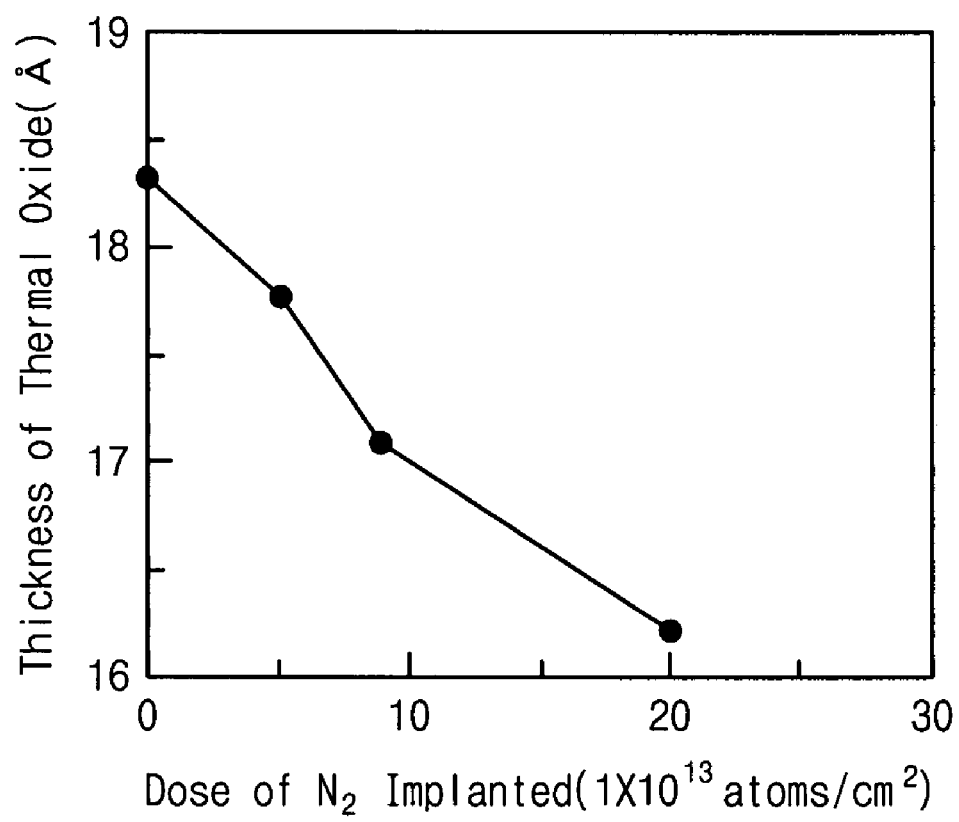
FIG. 1 is a graph showing a correlation between a dose of nitrogen ions implanted into a silicon substrate and a thickness of thermal oxide.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a graph illustrating a correlation between a dose of nitrogen ions implanted into a silicon substrate and a thickness of thermal oxide.

Referring to FIG. 1, after implanting nitrogen ($N_2$) into a silicon substrate at given or desired doses, a thermal oxidation process may be performed to form silicon oxide ($SiO_2$) on a surface of the silicon substrate. As shown in the graph of FIG. 1, a thickness of silicon oxide may increase with an increase in a dose of the implanted nitrogen. Thus, a thickness of a gate insulation layer formed by the thermal oxidation process may be regulated by the dose of the implanted nitrogen.

Figure 2:
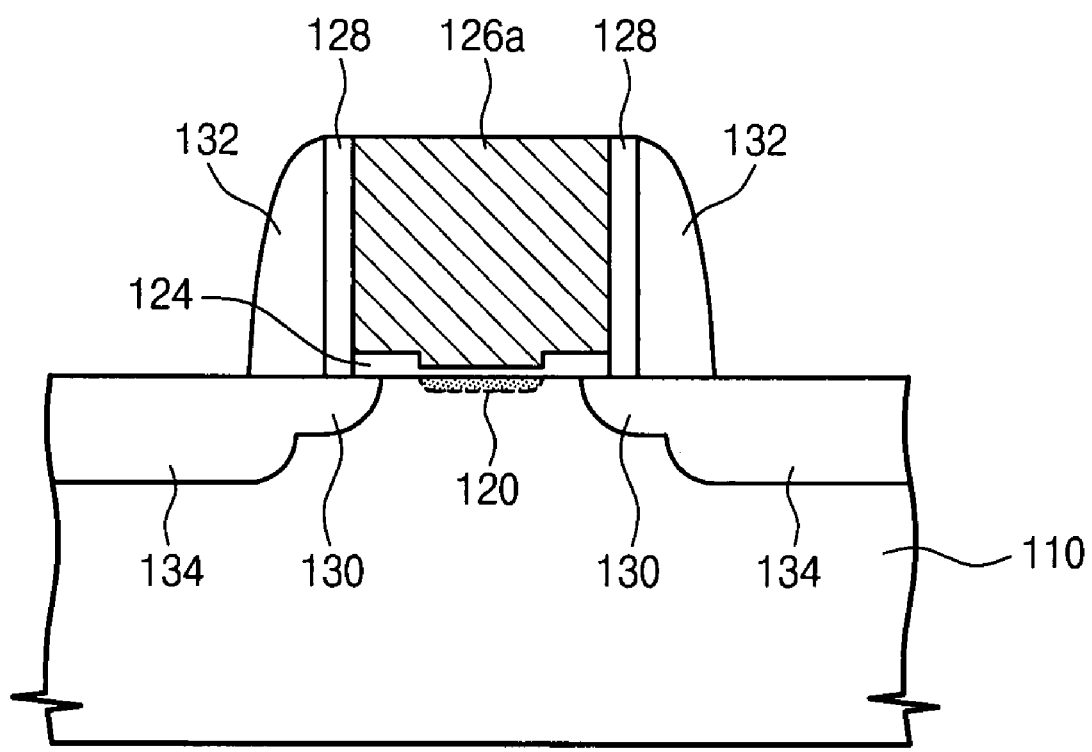
FIG. 2 is a cross-sectional view of a semiconductor device with a gate electrode according to an example embodiment.

FIG. 2 is a cross-sectional view of a semiconductor device with a gate electrode according to an example embodiment.

Referring to FIG. 2, the semiconductor device may include a semiconductor substrate 110. An oxidation barrier region 120 may be formed in the semiconductor substrate 110. A gate insulation layer 124 and a gate electrode 126a may be formed on the semiconductor substrate 110, sequentially. Offset spacers 128 may be formed or arranged at opposite sidewalls of the gate insulation layer 124 and the gate electrode 126a. Source/drain extension regions 130 may be formed in the semiconductor substrate 110 adjacent to the offset spacers 128. Insulating spacers 132 may be arranged or formed at the sidewalls of the offset spacers 128. Source/drain regions 134 may be formed in the semiconductor substrate 110 adjacent to the insulating spacers 132. Source/drain regions 134 may overlap the source/drain extension regions 130.

As described above with regard to FIG. 1, because the oxidation barrier region 120 is a region where nitrogen is implanted into the semiconductor substrate 110, the oxidation barrier region 120 may suppress growth of the gate insulation layer 124 formed using, for example, a thermal oxidation process. Thus, the gate insulation layer 124 may have a larger thickness at or near an edge portion than at or near the oxidation barrier region 120.

According to at least one example embodiment, a thickness of the gate insulation layer 124 may be increased to suppress and/or prevent generation of gate induced drain leakage (GIDL). At the edge portion of the gate insulation layer 124, the gate insulation layer 124 may have a larger thickness to suppress and/or prevent the concentration of an electric field established between the gate electrode 126a and a drain extension region 130 adjacent to the gate electrode 126a. On the oxidation barrier region 120, the gate insulation layer 124 may have a smaller thickness to suppress and/or prevent degradation of operating characteristics of semiconductor devices.

FIGS. 3A through 3L are cross-sectional views illustrating a method of fabricating a semiconductor device according to an example embodiment.

Figure 3A:
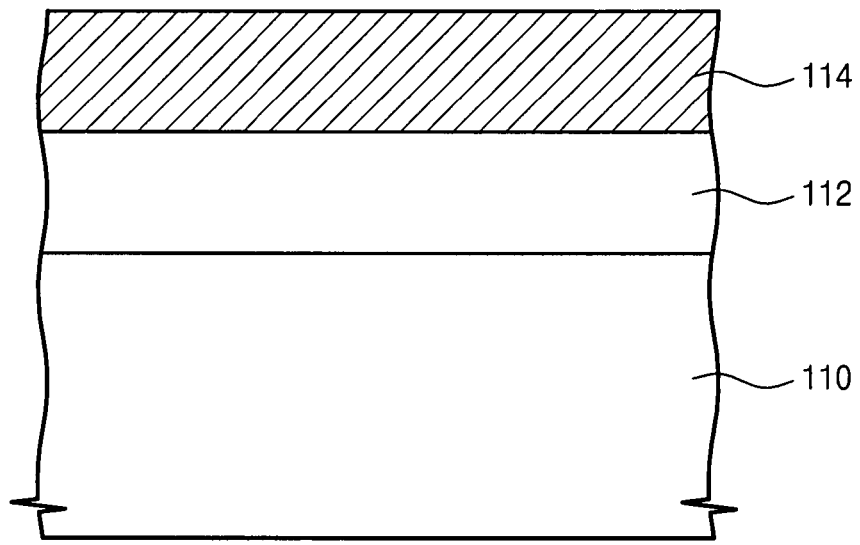
FIGS. 3A through 3L are cross-sectional views illustrating a method of fabricating a semiconductor device according to an example embodiment.

Referring to FIG. 3A, a lower mask layer 112 and an upper mask layer 114 may be formed (e.g., sequentially formed) on a semiconductor substrate 110. The lower mask layer 112 may be, for example, a silicon oxide layer formed by a thermal oxidation process. However, any other similar material and/or formation process may be used. According to at least one example embodiment, the lower mask layer 112 may be formed by thermally oxidizing the semiconductor substrate 110 at a temperature of about 800° C. to a thickness ranging from about 500 Å to about 3,000 Å, inclusive. The upper mask layer 114 may be formed of, for example, silicon nitride ($Si_xN_y$) by a chemical vapor deposition (CVD) process. However, any other similar material and/or formation process may be used. The upper mask layer 114 may be formed at a temperature of about 760° C. to a thickness ranging from about 500 Å to about 3,000 Å, inclusive. A thickness of at least a portion of the upper mask layer 114 may be reduced (e.g., a portion of the upper mask layer 114 may be removed) during an etch process to form a first mask pattern with a T-shaped opening. The lower and upper mask layers 112 and 114 may have similar or substantially similar thicknesses.

Figure 3B:
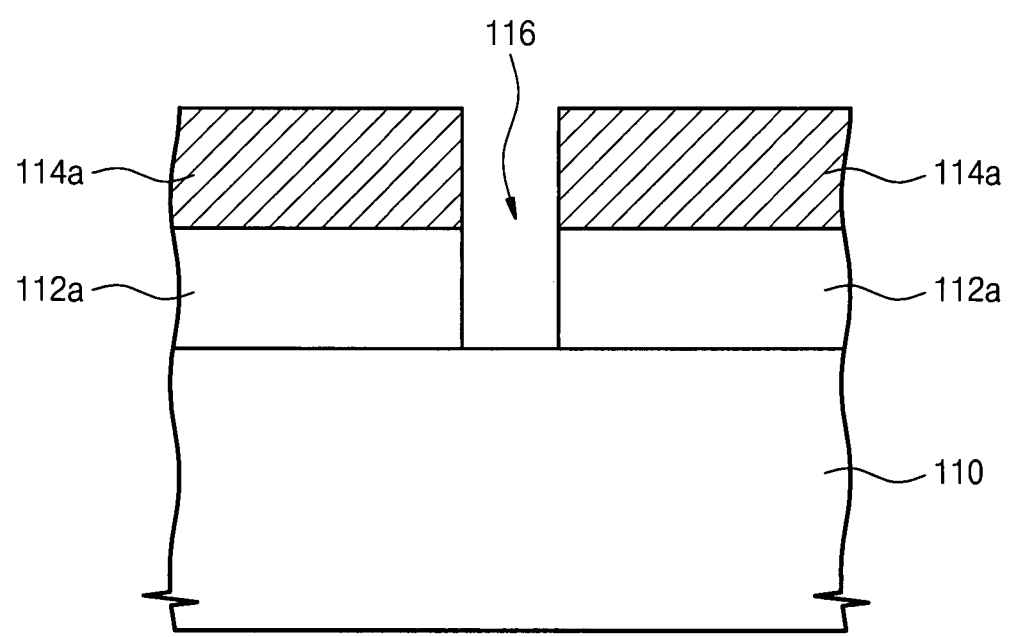

Referring to FIG. 3B, the upper mask layer 114 and the lower mask layer 112 may be etched to form an upper mask layer pattern 114a and a lower mask layer pattern 112a with a preliminary opening 116. The preliminary opening may expose a given or desired region or portion of the semiconductor substrate 110. The etching of the upper and lower mask layers 114 and 112 may be performed using an anisotropic dry etch process or the like.

Figure 3C:
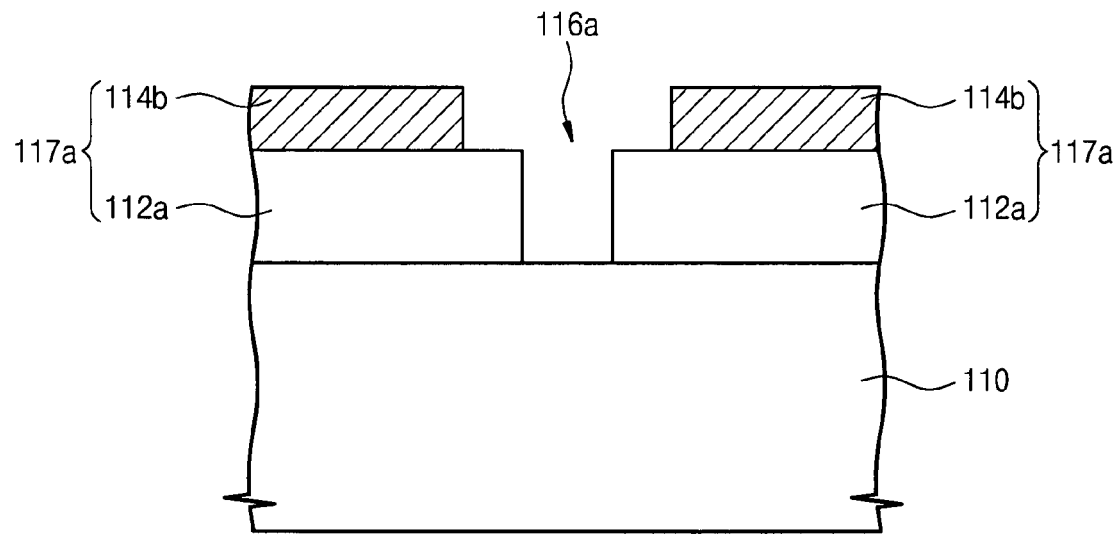

Referring to FIG. 3C, the upper mask layer pattern 114a may be partially etched to form a first mask pattern 117a. The first mask pattern 117a may have a T-shaped opening 116a exposing a portion of the edge of the lower mask layer pattern 112a. Thus, the first mask pattern 117a having a T-shaped opening 116 may include the lower mask layer pattern 112a and a partially etched upper mask layer pattern 114b. The partial etching of the upper mask layer pattern 114a may be performed using a pull-back etch process or the like. The pull-back etch process may be an isotropic wet etch process or the like using an etchant such as phosphoric acid or the like. At least a portion of the upper mask layer pattern 114a may be removed, for example, isotropically. In one example embodiment, a thickness of the upper mask layer pattern 114a ranging from about 50 to about 1,000 Å, inclusive may be removed.

Figure 3D:
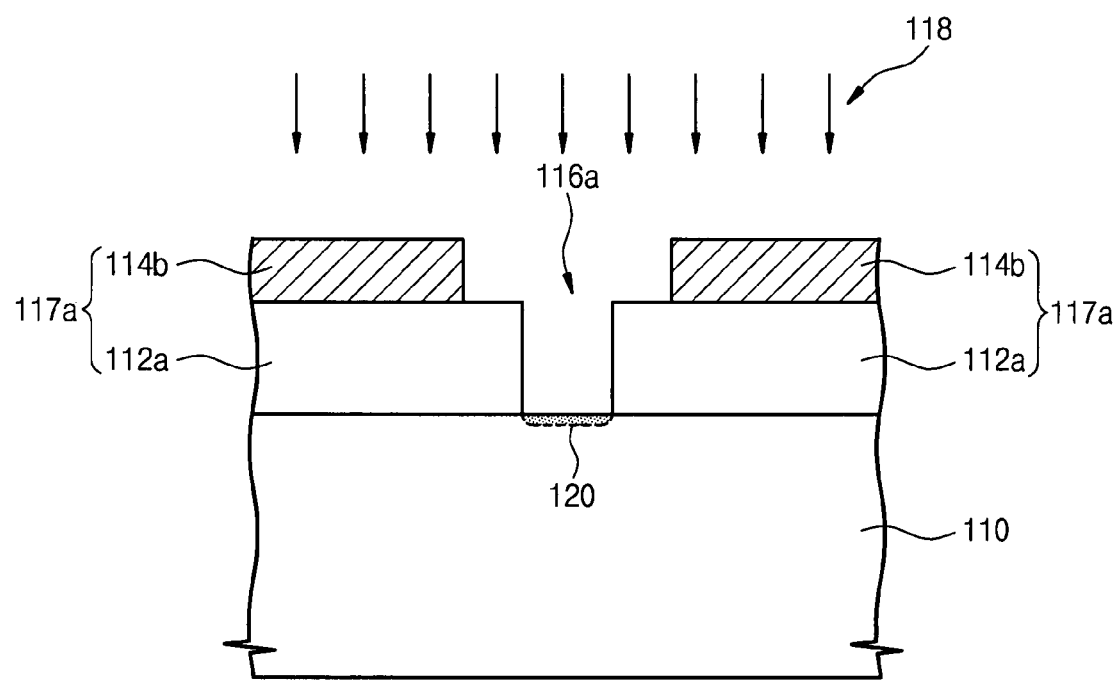

Referring to FIG. 3D, an oxidation barrier region 120 may be formed in the exposed portion of the semiconductor substrate 110. During a thermal oxidation process performed to form a gate insulation layer, the oxidation barrier region 120 may suppress the growth of silicon oxide. Thus, the gate insulation layer may have a smaller thickness on the oxidation barrier region 120.

The oxidation barrier region 120 may be formed using a nitrogen ion implanting process 118 or the like. Thus, the oxidation barrier region 120 may include nitrogen atoms. The nitrogen ion implanting process 118 may be performed at an energy of between about 2 keV and 20 keV, inclusive, and using a dose of about $1 \times 10^{12}$ atoms/cm$^2$ to about $1 \times 10^{14}$ atoms/cm$^2$, inclusive.

Figure 3E:
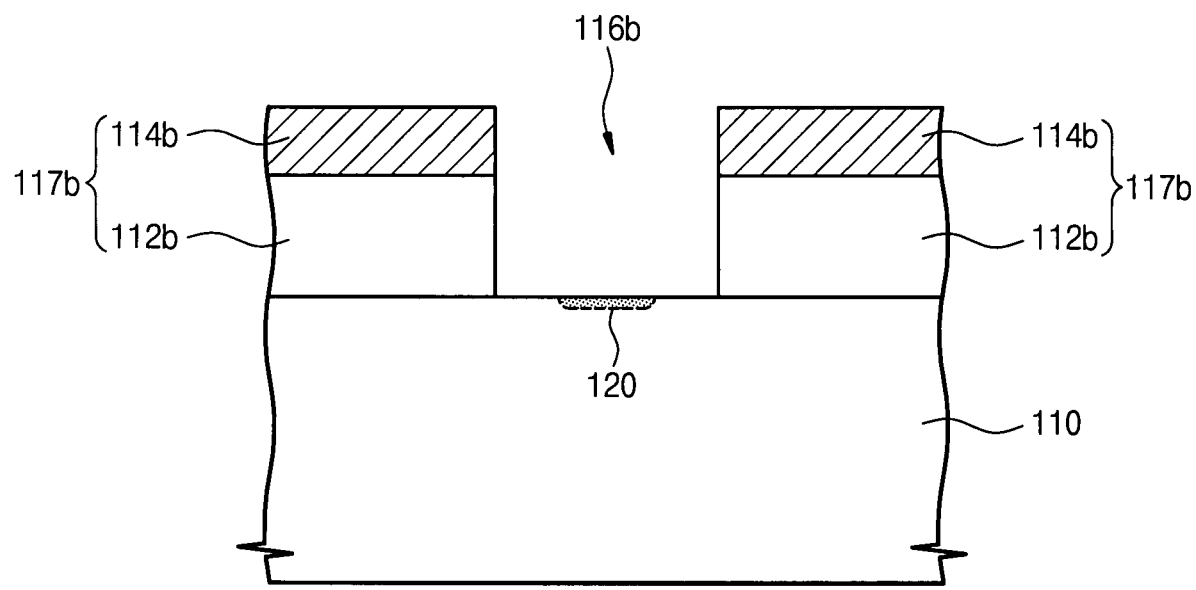

Referring to FIG. 3E, the first mask pattern 117a may be patterned to form a second mask pattern 117b having an I-shaped opening 116b. The I-shaped opening 116b of the second mask pattern 117b may define a region in which a gate insulation layer may be formed. The I-shaped opening 116b may include a central portion including the oxidation barrier region 120 and an outside edge portion of the oxidation barrier region 120.

The formation of the second mask pattern 117b may include removing the edge portion of the lower mask layer pattern 112a exposed by the upper mask layer pattern 114b. The removal of the exposed portion of the edge of the lower mask layer pattern 112a may be performed using a dry etch process, a wet etch process using hydrofluoric acid (HF) or the like.

Figure 3F:
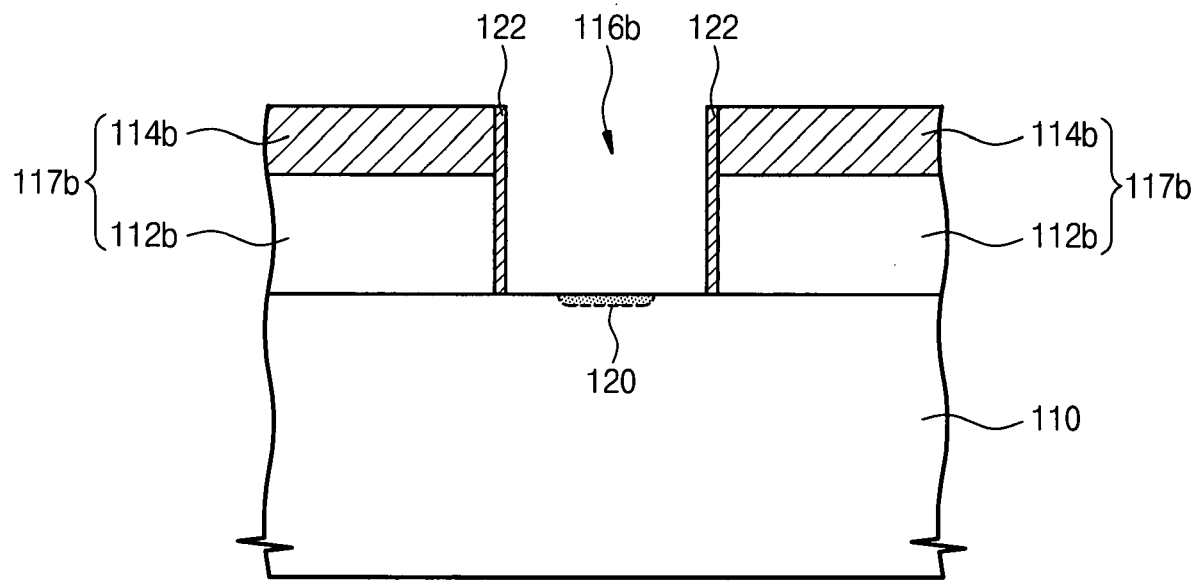

Referring to FIG. 3F, a sacrificial spacer 122 may be formed on at least one (e.g., each) inner sidewall of the I-shaped opening 116b of the second mask pattern 117b. The sacrificial spacer 122 may include silicon nitride. According to at least this example embodiment, the sacrificial spacer 122 may be formed using a deposition process and an etching process. The deposition process may include a diffusion process, a CVD process or the like. For example, a CVD process may be performed at a temperature of about 765° C. to for the sacrificial spacer 122 to a thickness ranging from about 50 Å to about 500 Å, inclusive. The sacrificial spacer 122 may be etched using an anisotropic dry etch process or the like.

Figure 3G:
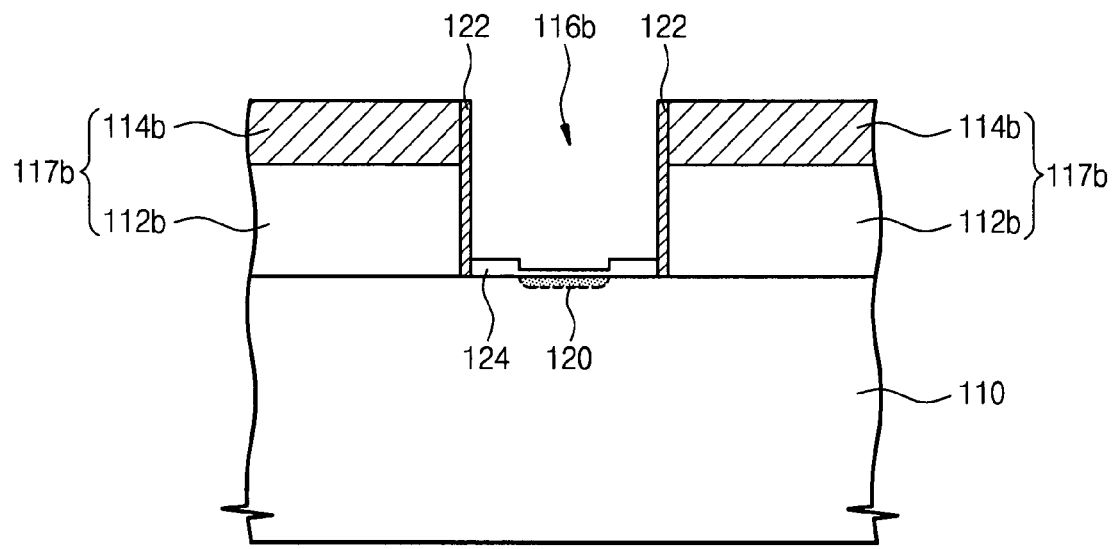

Referring to FIG. 3G, a gate insulation layer 124 may be formed on the portion of the semiconductor substrate 110 exposed by the I-shaped opening 116b. The gate insulation layer 124 may be formed using an oxidation process or the like.

As described above with reference to FIG. 1, silicon oxide formed on the surface of the semiconductor substrate 110 may decrease in thickness with an increase in concentration of nitrogen introduced into the oxidation barrier region 120. Thus, the gate insulation layer 124 formed using a thermal oxidation process may have a thickness regulated by a dose of the introduced nitrogen on the oxidation barrier region 120 and/or have a larger thickness at the outside edge portion of the oxidation barrier region 120. For example, the gate insulation layer 124 may have a thickness ranging from about 12 Å to about 15 Å, inclusive, on the oxidation barrier region 120 and a thickness ranging from about 120 Å to about 150 Å, inclusive, at the outer or outside edge portion of the oxidation barrier region 120.

Figure 3H:
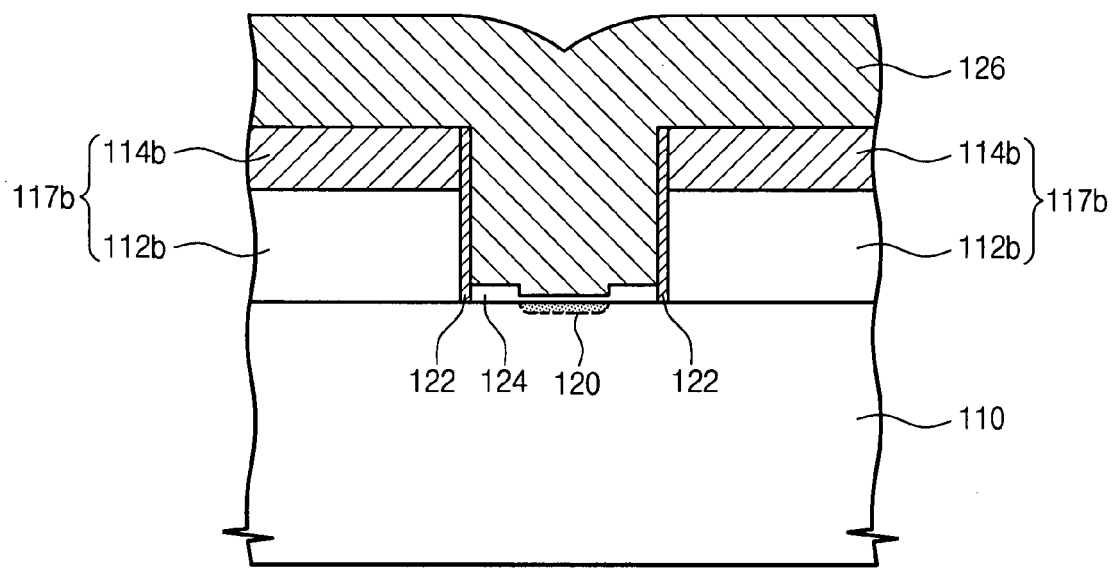
Figure 3I:
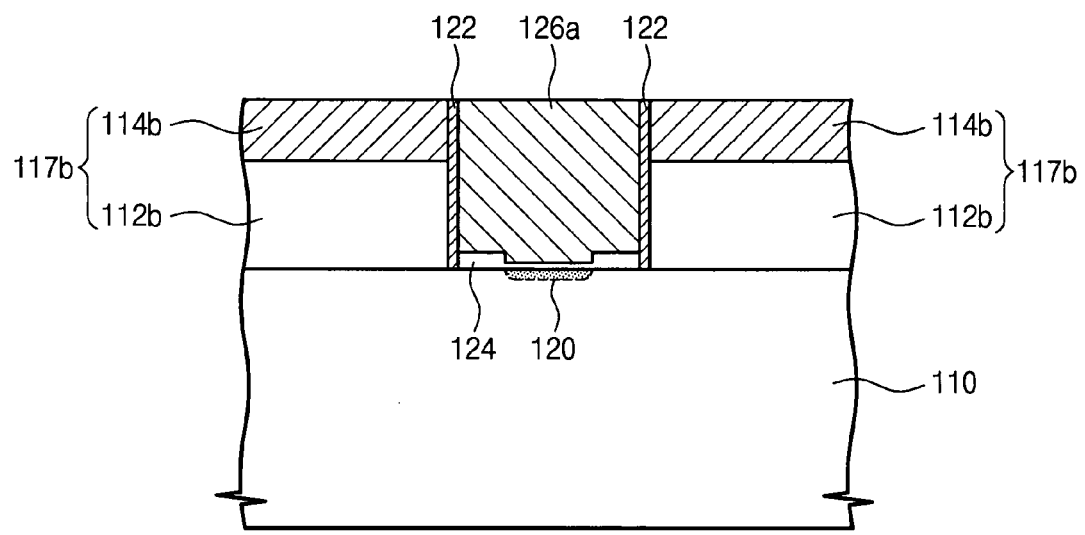

Referring to FIGS. 3H and 3I, a gate conductive layer 126 may be formed to at least partially (e.g., completely) fill the I-shaped opening 116b. The gate conductive layer 126 may include, for example, polysilicon or the like. The gate conductive layer 126 may be planarized using a polishing or similar process, using the second mask pattern 117b as a polish-stop layer, to form a gate electrode 126a. According to at least one example embodiment, the polishing process may include a chemical mechanical polishing (CMP) process performed to expose the second mask pattern 117b.

Figure 3J:
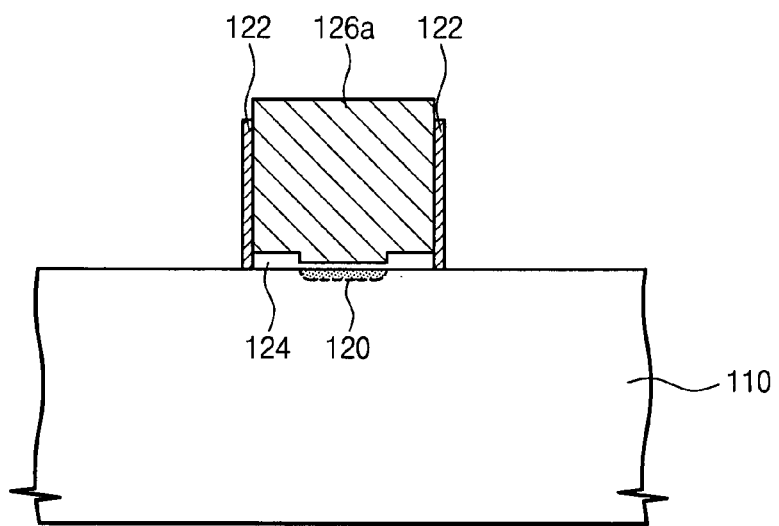

Referring to FIG. 3J, after forming the gate electrode 126a, the second mask pattern 117b may be removed. The second mask pattern 117b may be removed using a wet etch process or the like. The upper mask layer pattern 114b and the lower mask layer pattern 112b of the second mask pattern 117b may be removed by a wet etch process using an etchant such as phosphoric acid and a wet etch process using an etchant such as hydrofluoric acid (HF), respectively. The sacrificial spacer 122 may suppress and/or prevent the gate insulation layer 124 from being etched during the removal of the lower mask layer pattern 112b, which may suppress the concentration of an electric field caused by a relatively bad profile of the gate insulation layer 124.

After or concurrently with the removing of the second mask pattern 117*b*, the sacrificial spacer 122 may be removed. The sacrificial spacer 122 may be removed using a wet etch or similar process using phosphoric acid or the like as an etchant. Alternatively, the sacrificial spacer 122 may not be removed. The sacrificial spacer 122 may be included in an offset spacer during offset spacer forming process.

Figure 3K:
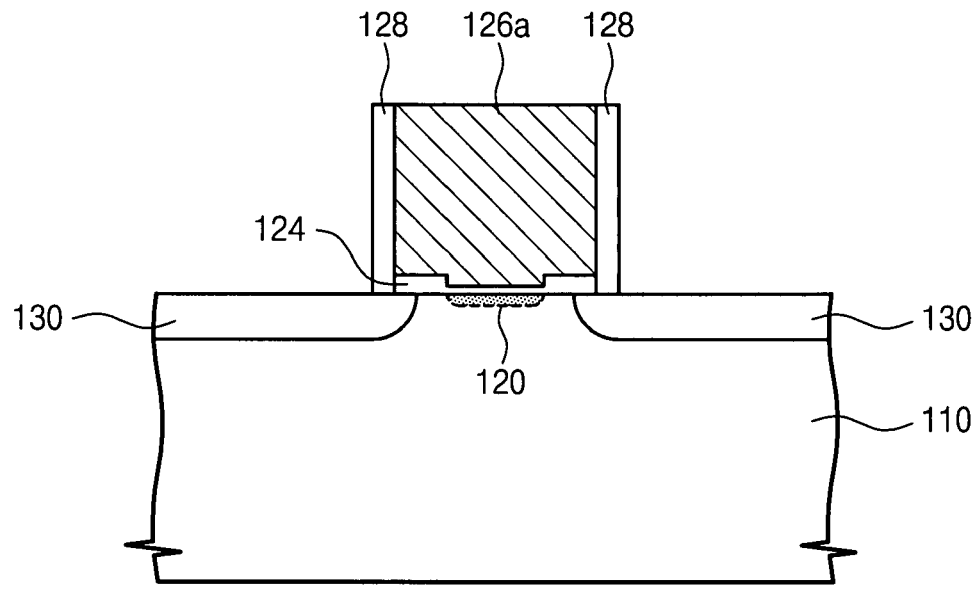
Figure 3L:
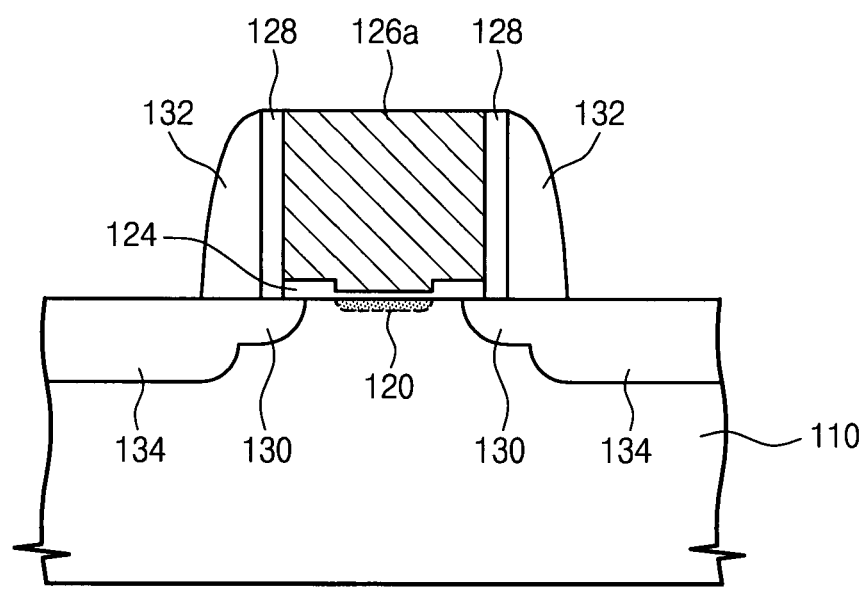

Referring to FIGS. 3K and 3L, an offset spacer 128 may be formed on opposite sidewalls of the gate insulation layer 124 and the gate electrode 126*a*. The offset spacer 128 may include thermal oxide, low temperature oxide (LTO) or the like. Alternatively, the offset spacer 128 may include thermal oxide and/or LTO. According to at least one example embodiment, the offset spacer 128 may have a stack structure including thermal oxide and LTO which are stacked in the order name. The thermal oxide may be formed of silicon oxide using, for example, a rapid thermal oxidation (RTO) or similar process. The RTO process may be performed at a temperature ranging from about 700° C. to about 950° C., inclusive, and the thermal oxide may be formed to a thickness ranging from about 20 Å to about 100 Å, inclusive. The LTO may be formed of a material in a silicon oxide or similar group and may have a thickness ranging from about 30 Å to about 300 Å, inclusive, using a CVD process performed at a temperature ranging from about 450° C. to about 700° C., inclusive.

The formation of the thermal oxide may include forming gate polysilicon oxide using a thermal oxidation or similar process, and etching the gate polysilicon oxide using an anisotropic dry etch or similar process. The formation of the LTO may include forming silicon oxide at a lower or relatively low temperature using a CVD or similar process, and etching the silicon oxide using an anisotropic dry etch or similar process. The formation of the stack structure may include forming silicon oxide on the gate polysilicon oxide at a lower or relatively low temperature using a CVD or similar process and etching the silicon oxide and the gate polysilicon oxide using an anisotropic dry etch or similar process.

A source/drain extension region 130 may be formed adjacent to the offset spacer 128 in the semiconductor substrate 110. In one example embodiment, the source/drain extension region 130 may be formed by injecting impurity ions.

A source/drain region 134 may be formed in the semiconductor substrate 110 adjacent to an insulating spacer 132 to at least partially overlap the source/drain extension region 130. The source/drain region 134 may be formed after the insulating spacer 132 is formed on the sidewall of the offset spacer 128. The source/drain region 134 may be formed by injecting impurity ions to have a higher concentration than that of the source/drain extension region 130.

A semiconductor device having a gate electrode may be fabricated using methods according to example embodiments to form a stepped gate insulation layer. Using example embodiments, thickness of the gate insulation layer may be different at a more central portion than at or near an edge portion. As a result, concentration of an electric field established between the gate electrode and a drain extension region adjacent to the gate electrode may be suppressed and/or prevented. The gate insulation layer having a smaller thickness at a more central portion than at an edge portion may result in the semiconductor device having improved operating characteristics.

As described above, the gate insulation layer may be formed to suppress and/or prevent leakage current of the semiconductor device and enhance operating characteristics, which may result in the semiconductor device having more stable and/or improved operating characteristics.

Although the present invention has been described in connection with example embodiments illustrated in the accompanying drawings, it is not limited thereto. It will be apparent to those skilled in the art that various substitutions, modifications and changes may be made without departing from the scope and spirit.

What is claimed is:

1. A method of fabricating a semiconductor device, the method comprising:
   forming a first mask pattern on a substrate, the first mask pattern having a first opening exposing a first portion of the substrate, the first opening being T-shaped, wherein
   the first mask pattern includes a lower mask layer pattern and an upper mask layer pattern,
   the lower mask layer pattern exposes the first portion of the substrate, and
   the upper mask layer pattern exposes a portion of the lower mask layer pattern;
   forming an oxidation barrier region in the exposed first portion of the substrate;
   patterning the first mask pattern to form a second mask pattern having a second opening, the second opening exposing a second portion of the substrate, the second opening being I-shaped, wherein
   a width of the lower mask layer pattern is the same width as the upper mask layer pattern; and
   forming a gate insulation layer on the exposed second portion of the substrate, the gate insulation layer having a variable thickness, wherein
   a width of the second opening substantially has the same width as an upper part of the first opening, and
   the width of the second opening is wider than a width of a lower part of the first opening.

2. The method as set forth in claim 1, wherein the gate insulation layer has a larger thickness at an edge portion than at the oxidation barrier region.

3. The method as set forth in claim 1, wherein the forming the first mask pattern includes:
   forming a lower mask layer on the substrate;
   forming an upper mask layer on the lower mask layer;
   etching the upper mask layer and the lower mask layer to form the upper mask layer pattern and the lower mask layer pattern, the upper mask layer pattern and the lower mask layer pattern exposing the first portion of the substrate; and
   partially etching the upper mask layer pattern to expose the portion of the lower mask layer pattern.

4. The method as set forth in claim 3, wherein the upper mask layer has a higher etch selectivity than the lower mask layer.

5. The method as set forth in claim 3, wherein the upper mask layer includes silicon nitride.

6. The method as set forth in claim 3, wherein the lower mask layer includes silicon oxide.

7. The method as set forth in claim 3, wherein the forming the second mask pattern includes;
   removing the exposed portion of the lower mask layer pattern.

8. The method as set forth in claim 1, wherein the oxidation barrier region is formed using a nitrogen ion implanting process.

9. The method as set forth in claim 1, further including,
   forming a spacer on an inner sidewall of the second opening.

10. The method as set forth in claim 9, wherein the spacer includes silicon nitride.

11. The method as set forth in claim 1, wherein the gate insulation layer is formed using a thermal oxidation process.

12. The method as set forth in claim 9, further including,
forming a gate conductive layer to fill the second opening,
planarizing the gate conductive layer to form a gate electrode, and
removing the second mask pattern and the spacer.

13. The method as set forth in claim 12, wherein the gate conductive layer is planarized using a polishing process using the second mask pattern as a polish-stop layer.

14. The method as set forth in claim 13, wherein the polishing process includes a chemical mechanical polishing process.

15. The method as set forth in claim 12, wherein the gate conductive layer includes polysilicon.

16. The method as set forth in claim 12, further including,
forming an offset spacer on opposite sidewalls of the gate insulation layer and the gate electrode,
forming an extension region adjacent to the offset spacer in the substrate,
forming an insulating spacer on a sidewall of the offset spacer, and
forming a source/drain region adjacent to the insulating spacer in the substrate, the source/drain region at least partially overlapping the extension region.

17. The method as set forth in claim 16, wherein the offset spacer includes at least one of a thermal oxide and a low temperature oxide.

18. The method as set forth in claim 16, wherein the offset spacer is arranged in a stack structure including the thermal oxide and the low temperature oxide which are stacked in the order name.

19. The method as set forth in claim 1, wherein the patterning of the first mask pattern to form the second mask pattern having the second opening exposing the second portion of the substrate includes,
etching a sidewall of the first mask pattern to form the second opening, the second opening being larger than the oxidation barrier region, and
forming a spacer on an inner sidewall of the second opening.

20. The method as set forth in claim 19, wherein the spacer includes silicon nitride.

21. The method as set forth in claim 19, further including,
forming a gate conductive layer to fill the second opening,
planarizing the gate conductive layer to form a gate electrode,
removing the second mask pattern and the spacer,
forming an offset spacer on opposite sidewalls of the gate insulation layer and the gate electrode,
forming an extension region adjacent to the offset spacer in the substrate,
forming an insulating spacer on a sidewall of the offset spacer, and
forming a source/drain region adjacent to the insulating spacer in the substrate, the source/drain region at least partially overlapping the extension region.

22. The method of claim 21, wherein the planarizing gate conductive layer is planarized using a polishing process using the mask pattern as a polish-stop layer.

* * * * *